(12) United States Patent
Lin

(10) Patent No.: US 7,337,026 B2
(45) Date of Patent: Feb. 26, 2008

(54) DIGITAL AUDIO VOLUME CONTROL

(75) Inventor: Jason J Lin, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 798 days.

(21) Appl. No.: 10/708,703

(22) Filed: Mar. 19, 2004

(65) Prior Publication Data

US 2005/0209718 A1    Sep. 22, 2005

(51) Int. Cl.
*H03G 3/00* (2006.01)

(52) U.S. Cl. .................................. 700/94; 381/104

(58) Field of Classification Search ............... 381/104; 700/94
See application file for complete search history.

(56) References Cited

U.S. PATENT DOCUMENTS

| | | | |
|---|---|---|---|
| 4,931,796 A * | 6/1990 | Hasegawa et al. | 341/154 |
| 5,339,079 A * | 8/1994 | Ledzius et al. | 341/144 |
| 6,388,525 B1 * | 5/2002 | Bien | 330/282 |
| 6,405,092 B1 * | 6/2002 | Oxford | 700/94 |

* cited by examiner

*Primary Examiner*—Sinh Tran
*Assistant Examiner*—Walter F Briney, III
(74) *Attorney, Agent, or Firm*—Winston Hsu

(57) ABSTRACT

A serial interface has an input for receiving a digital audio signal and an output for serially outputting bits of the digital audio signal. A shift register includes a serial input connected to the output of the serial interface for storing bits of the digital audio signal. A first-in-first-out (FIFO) buffer has a parallel input connected to a parallel output of the shift register. A digital-to-analog processor is connected to a parallel output of the FIFO. A volume controller initiates loading of bits in the shift register into the FIFO according to a volume control signal to effect a coarse volume adjustment. The volume controller also adjusts resistances of an analog amplifier to effect a fine volume adjustment.

8 Claims, 3 Drawing Sheets

DIGITAL AUDIO VOLUME CONTROL

BACKGROUND OF INVENTION

1. Field of the Invention

The present invention relates to digital audio, and more specifically, to volume control in digital audio systems.

2. Description of the Prior Art

Digital audio systems are typically found in computers and portable electronics. Owing to the fact that digital data allows for easier error detection and data correction, digital audio systems are generally more reliable in reproducing high-fidelity output.

FIG. 1 illustrates a representative analog audio signal 10 along with an 8-bit digital representation 12 at a sample point 14. Typically, the entire audio signal is sampled in this way, however, only one sample point is shown here for clarity. At the sample point 14, the level of the analog audio signal 10 is shown to have a binary value of "10101101" (decimal value "173"), which corresponds to a volume. Such sampling is usually initially performed by a analog-to-digital converter; within the domain of a digital audio system, samples such as the 8-bit digital representation 12 are used.

In the prior art, volume (or level) control can be preformed in the analog or digital domain. In the analog domain, that is, after digital signal processing but prior to speaker output, an operational amplifier having variable input and feedback resistances is usually used. In chip-based applications, these variable resistances are implemented by a resistor tree or the like and an associated multiplexer. As such, volume control in the analog domain can be hardware and time intensive.

Volume control in the digital domain can be accomplished by arithmetic processing of the digital signal (such as signal 12 of FIG. 1). Such processing can be accomplished by a multiplier for multiplying the signal by level factors stored and selected from a read-only memory (ROM). This is a flexible approach since the resolution of volume control depends mainly on the size of the ROM. However, this is also a hardware and time demanding method.

Improvements in audio schemes (e.g. Intels Azalia) place constant demand on the industry to improve and create new methods of signal processing. As such, there is a need for an improved method of digital audio volume control, and specifically, one which reduces hardware complexity while improving performance.

SUMMARY OF INVENTION

It is therefore a primary objective of the claimed invention to provide an audio processing circuit and a method for adjusting the volume of a digital audio signal.

Briefly summarized, the claimed invention includes a serial interface having an input for receiving a digital audio signal and an output for serially outputting bits of the digital audio signal, a shift register having a serial input connected to the output of the serial interface for storing bits of the digital audio signal, a first-in-first-out (FIFO) buffer having a parallel input connected to a parallel output of the shift register, a volume controller for initiating loading of bits in the shift register into the FIFO according to a volume control signal, and a digital-to-analog processor connected to a parallel output of the FIFO.

According to the claimed invention a method for adjusting the volume of a digital audio signal serially receives bits of the digital audio signal, sets a loading delay according to a volume control signal, forwards in parallel a segment of the received bits at the expiry of the loading delay, and processes the segment of bits into an analog audio signal. The positions of the bits in the segment are directly related to the volume of the analog audio signal.

It is an advantage of the claimed invention that volume control of a digital audio signal is simplified.

It is an advantage of the claimed invention that hardware requirements for volume control of a digital audio signal are reduced.

It is an advantage of the claimed invention that the volume controller and setting a loading delay according to a volume control signal are readily adaptable to existing and emerging digital audio schemes.

These and other objectives of the claimed invention will no doubt become obvious to those of ordinary skill in the art after reading the following detailed description of the preferred embodiment that is illustrated in the various figures and drawings.

DETAILED DESCRIPTION

Figure 2:
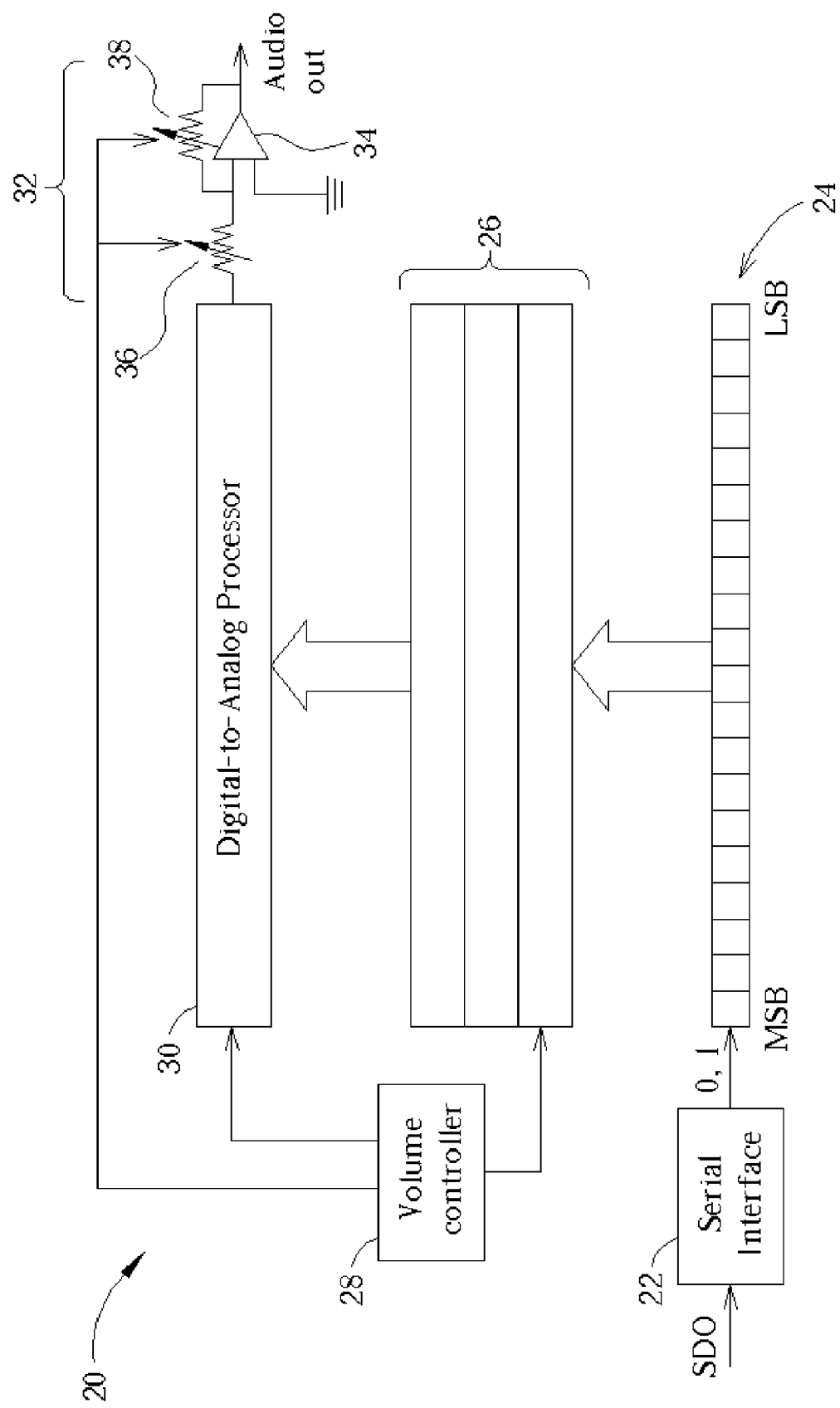
FIG. 2 is a block diagram of an audio processing circuit according to the present invention.

Please refer to FIG. 2 illustrating an audio processing circuit 20 according to the present invention. The circuit 20 includes a serial interface 22, a shift register 24, a first-in-first-out (FIFO) buffer 26, a volume controller 28, a digital-to-analog processor 30, and an analog amplifier 32. The output of the serial interface 22 is connected to the serial input of the shift register 24. The parallel output of the shift register 24 is connected to the parallel input of the FIFO buffer 26, which has a parallel output connected to the digital-to-analog processor 30. The shift register 24 and FIFO buffer 26 are shown to handle segments of 20 bits, however other sizes are permitted such as 8, 16, and 24 resulting in a corresponding decrease or increase in hardware required. The volume controller 28 has outputs connected to the FIFO 26, the digital-to-analog processor 30, and the analog amplifier 32, however in other embodiments these connections can be made selectively depending on the specific system. For example, if analog amplification is not required in one embodiment, the line(s) connected the volume controller 28 and the analog amplifier 32 can be omitted. The output of the digital-to-analog processor 30 is connected to the input of the analog amplifier 32, which includes an operational amplifier 34, an input variable resistor 36, and a feedback variable resistor 38. Audio output is taken from the analog amplifier 32. Typically, the audio processing circuit 20 would handle one channel of an audio stream.

Figure 1:
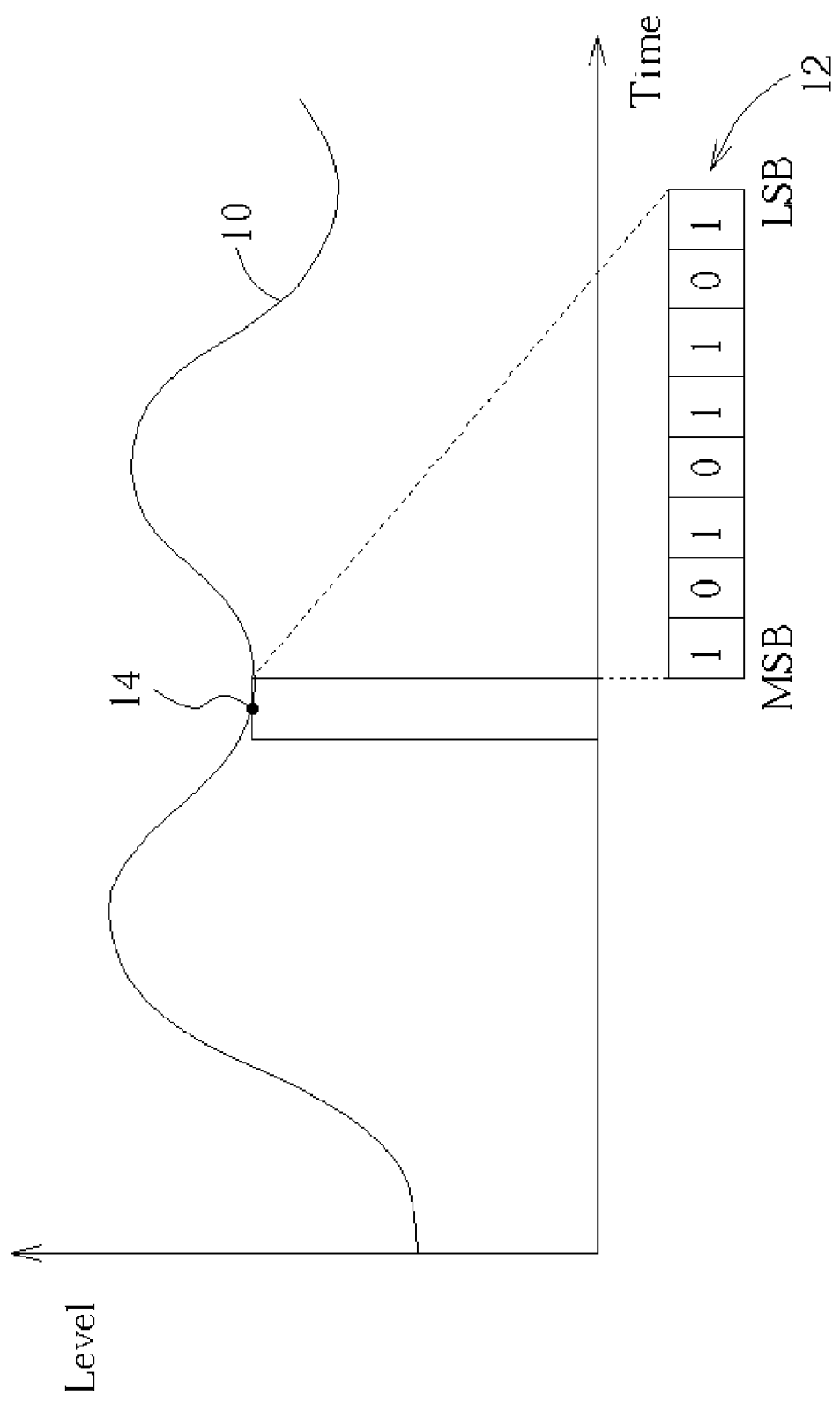
FIG. 1 is a graph of an analog audio signal and a digitizing scheme.

The serial interface 22 receives a digital audio signal SDO and serially outputs bits of the digital audio signal SDO to the shift register 24. The digital audio signal SDO has a conventional digital form such as that illustrated in FIG. 1. The shift register 24 stores bits ("1" or "0") of the digital audio signal SDO. When a new bit is input to the shift register 24 from the serial interface 22, the bits present in the shift register 24 are shifted to the right, with the rightmost bit being discarded or otherwise handled. The serial segment of bits in the shift register 24 can be forwarded to the FIFO buffer 26. The FIFO buffer 26 advances received segments (FIG. 2 shows three rows, however, more or fewer are also acceptable) according to timing information received from other components. A segment exiting the FIFO buffer 26 is input to the digital-to-analog processor 30 which performs required filtering and Σ operations, in addition to any other audio processing required. Finally, the output of the digital-to-analog processor 30 is forwarded to the analog amplifier 32, which amplifies the output by the ratio of resistances of the resistors 38 and 36.

The volume controller 28 has three functions according to the present invention. First, the volume controller 28 controls the load timing of the FIFO buffer 26 to allow coarse adjustments to the volume of the audio. Second, the volume controller 28 controls the variable resistances of the resistors 36, 38 to allow fine adjustments to the volume of the audio. Third, the volume controller 28 provides a mute function by setting the bits of at least a segment to a predetermined value (e.g. all to "0") at the digital-to-analog processor 30 (in other embodiments, this could be at another component such as the shift register 24 or the FIFO 26). These coarse, fine, and mute adjustments are described in detail as follows.

The coarse volume adjustment is made by the volume controller 28 setting the loading delay of the FIFO buffer 26, the loading delay being the time (measured in clock cycles for example) after which the contents of the shift register 24 is loaded into the FIFO 26. Conventionally, the FIFO 26 is loaded when filling of the shift register 24 with a new segment is completed. When the volume controller 28 delays loading the FIFO 26 with the contents of the shift register 24 by one bit, the effect is that the segment loaded into the FIFO 26 is right shifted by one bit. When the bits of the shift register 24 are loaded with increasing significance (i.e. the most significant bit and the least significant bit are as shown in FIG. 2), the lengthening of the loading time corresponds to a volume attenuation of the segment. If the MSB-LSB order is reversed, an amplification results. When the volume controller 28 speeds loading the FIFO 26 with the contents of the shift register 24 by one bit, the effect is that the segment loaded into the FIFO 26 is left shifted by one bit. Then, when the bits of the shift register 24 are loaded with increasing significance, the shortening of the loading time corresponds to a volume amplification of the segment. Likewise, if the MSB-LSB order is reversed, an attenuation results. The delaying or speeding of loading can be by any number of bits, with each bit corresponding to a fixed attenuation or amplification.

For data continuity, if the loading is delayed, the serial interface 22 (or other suitable component) must insert dummy bits (such as by extending the sign bit) rather than beginning to load the next segment. If the loading is speeded, the least significant bit(s) must be ignored or compensated for since is would be part of the previous segment. One way of doing this is to pad the MSB of the previous segment when it is known that loading of the next segment will be sped. The padding of bits depends on the data structure, so the numerous possibilities are not further discussed here.

Finally, with regards to the coarse volume adjustment, it should be noted that if the MSB-LSB significance order of the shift register 24 were to be reversed, delaying and loading the FIFO 26 load time would have the opposite effects as described above. Since this situation is analogous to that described, it will not be addressed further.

The fine volume adjustment is made by the volume controller 28 adjusting the ratio of resistances of the resistors 36, 38 of the amplifier 32. The amplifier 32 amplifies its input according to the ratio $R_{38}/R_{36}$, where $R_{38}$ is the resistance of the resistor 38 and $R_{36}$ is the resistance of the resistor 36. The values of the resistances and the allowable adjustable range should be selected to allow the fine adjustment to be smaller than the coarse adjustment described above.

Regarding the coarse and fine adjustments, when the coarse adjustment is implemented to correspond to a 6.0 dB attenuation or amplification, the fine adjustment can be implemented to correspond to 1.5 dB steps over a 0 4.5 dB range (i.e. by a resistor tree having three resistor-transistor segments). This way, the digital audio signal SDO can be attenuated or amplified in 6.0 dB steps by the delaying or speeding of the loading the FIFO 26 and by 1.5 dB steps by the adjustment of the resistance ratio $R_{38}/R_{36}$ such that an attenuated or amplified audio output with a 1.5 dB volume resolution is obtained. Naturally other numerical values for coarse and fine adjustments can be selected, the above merely being examples.

In the third function, the mute function, the volume controller 28 controls the digital-to-analog processor 30 to set the bits of at least one segment to a predetermined value. The predetermined value depends on the data structure, but it is commonly "0". A zero data segment corresponds to no audio information (or silence) and results in downstream playback hardware outputting silence. The predetermined value may also be a binary silence code such as a string of 19 zeros with a "1" in the LSB. In other embodiments, the volume controller 28 could set the segment to the predetermined value at another component, with the shift register 24 begin a practical alternative.

Figure 3:
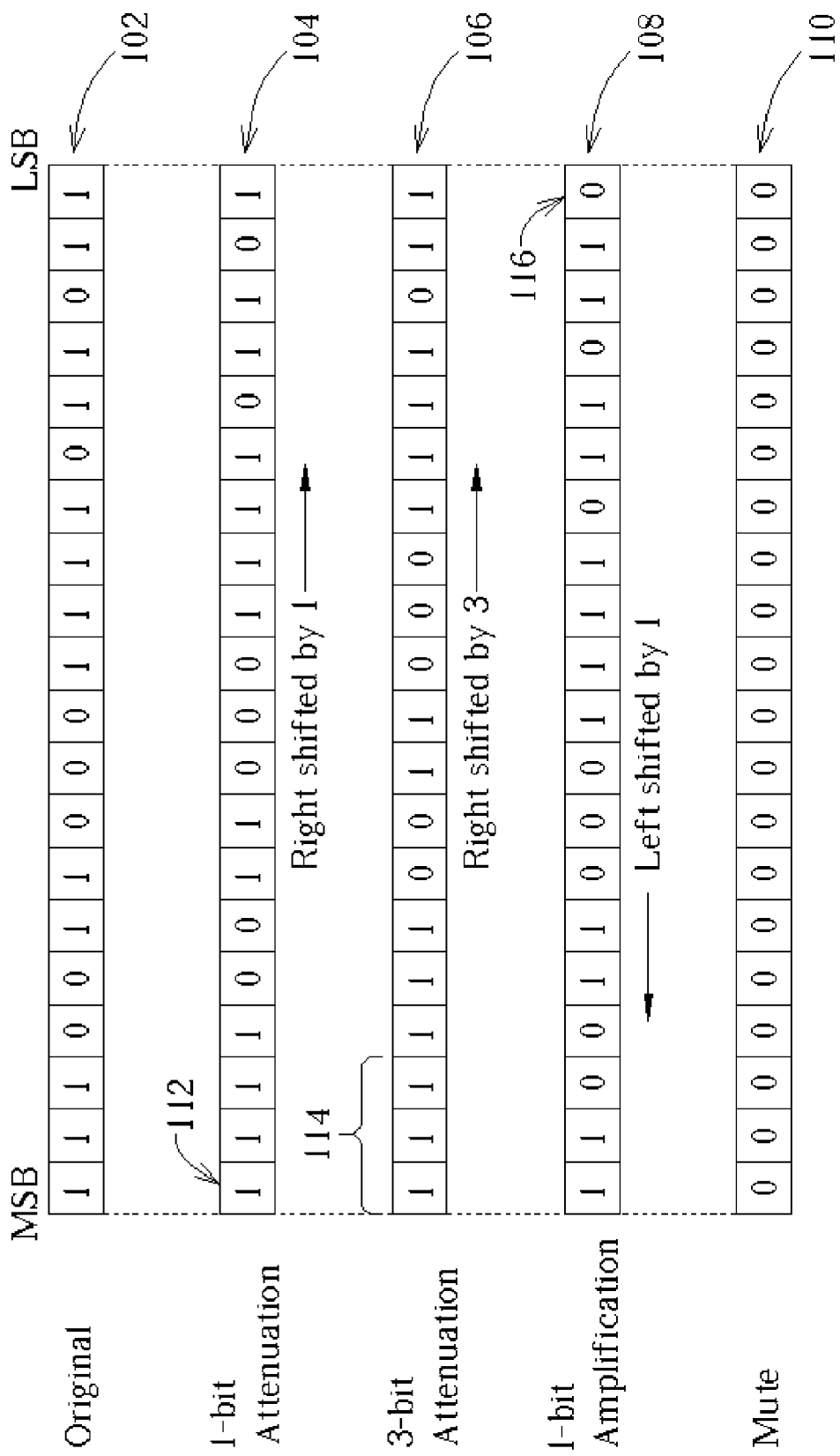
FIG. 3 is a schematic diagram of bits of signals in the circuit of FIG. 2.

FIG. 3 illustrates data segments undergoing attenuation, amplification, and muting in the present invention audio processing circuit 20. The segments shown are of the form that would be found in the FIFO 26 or the digital-to-analog processor 30 after being loaded from the shift register 24. A segment 102 shows original or unadjusted bits, which when output though the circuit 20 without operation of the volume controller 28 are output at a default level. A segment 104 shows 1-bit attenuation by the volume controller 28 delaying the loading of the FIFO 26 by one bit resulting in a right shift of one bit. Similarly, a segment 106 shows 3-bit attenuation 106 by the volume controller 28 delaying the loading of the FIFO 26 by three bit resulting in a right shift of three bits. Such right shifts require dummy bits 112, 114 to be inserted to complete the segments. This is accomplished, for example, by copying the sign bit "1" once for the 1-bit shifted segment 104 and three times for the 3-bit shifted segment 106. A segment 108 shows 1-bit amplification, which requires a dummy bit "0" 116 to be inserted at the LSB. Finally, a segment 110 illustrates the mute function, in which all bits of the segment 110 are set to "0" by the volume controller 28. It is important to keep in mind that the values shown in FIG. 3 are exemplary. That is, the sign bit can be "0", the MSB-LSB order can be reversed, the values of the inserted dummy bits can be changed, and the general appearance of the data may change to suit any data structure.

The present invention audio processing circuit 20 and the related method, and in particular the volume controller 28, can be implemented by hardware or software or any combination of hardware and software. Examples of hardware include semiconductor devices, logic gates, microcontrollers, central-processing units (CPUs), firmware, read-only memories (ROMs), random-access memories (RAMs), flash memories, and combinations of such. Examples of software include procedures, functions, programs, routines, subroutines, modules, software packages, classes, and combinations of instructions, data structures, and program statements.

In contrast to the prior art, the present invention audio processing circuit 20 and the related method adjust a loading time of a FIFO. The loading time is lengthened or shortened such that an audio data segment in a shift register is shifted before being loaded into the FIFO, wherein the shifting of the segment corresponds to a coarse volume adjustment. In addition, the present invention implements a fine volume adjustment at an analog amplifier, so that total volume control can be performed by a combination of coarse and fine adjustment. The results are that volume control of a digital audio signal is simplified, hardware requirements are reduced, and setting the loading delay according to the volume control signal is readily adaptable to digital audio schemes.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A digital audio volume control circuit comprising:
   a serial interface having an input for receiving a digital audio signal, and an output for serially outputting bits of the digital audio signal;
   a shift register having a serial input connected to the output of the serial interface for storing bits of the digital audio signal;
   a first-in-first-out (FIFO) buffer having a parallel input connected to a parallel output of the shift register;
   a volume controller connected to the FIFO, the volume controller initiating loading of bits in the shift register into the FIFO according to a volume control signal;
   a digital-to-analog processor connected to a parallel output of the FIFO; and
   an analog amplifier connected to an output of the digital-to-analog processor, the analog amplifier comprising an operational amplifier having a feedback variable resistance and an input variable resistance,
   wherein the volume controller delays or speeds loading of bits in the shift register into the FIFO according to a coarse component of the volume control signal, and the volume controller adjusts the feedback variable resistance or the input variable resistance according to a fine component of the volume control signal.

2. The digital audio volume control circuit of claim 1 wherein the volume controller is further connected to the digital-to-analog processor, and controls the output of the digital-to-analog processor to be a predetermined value when the volume control signal indicates a mute function.

3. An audio processing circuit comprising:
   a serial interface having an input for receiving a digital audio signal, and an output for serially outputting bits of the digital audio signal;
   a shift register having a serial input connected to the output of the serial interface for storing bits of the digital audio signal;
   a first-in-first-out (FIFO) buffer having a parallel input connected to a parallel output of the shift register;
   a volume controller connected to the FIFO, the volume controller initiating loading of bits in the shift register into the FIFO according to a volume control signal;
   a digital-to-analog processor connected to a parallel output of the FIFO; and
   an analog amplifier connected to an output of the digital-to-analog processor, the analog amplifier comprising an operational amplifier having a feedback variable resistance and an input variable resistance;
   wherein the volume controller delays or speeds loading of bits in the shift register into the FIFO according to a coarse component of the volume control signal, and the volume controller adjusts the feedback variable resistance or the input variable resistance according to a fine component of the volume control signal.

4. The audio processing circuit of claim 3 wherein the volume controller is further connected to the digital-to-analog processor, and controls the output of the digital-to-analog processor to be a predetermined value when the volume control signal indicates a mute function.

5. A method for adjusting the volume of a digital audio signal comprising:
   serially receiving bits of the digital audio signal;
   setting a loading delay according to a coarse component of a volume control signal;
   in parallel, forwarding a segment of the received bits at the expiry of the loading delay;
   processing the segment of bits into an analog audio signal, wherein the positions of the bits in the segment are directly related to the volume of the analog audio signal; and
   receiving a fine component of the volume control signal and accordingly attenuating or amplifying the analog audio signal by an amount less than a unit attenuation or amplification resulting from a minimum adjustment of the loading delay.

6. The method of claim 5 wherein setting the loading delay comprises lengthening the delay to the segment of thereby attenuating the digital audio signal, and shortening the loading delay to lift shift the bits of the segment thereby amplifying the analog audio signal, when the serial receiver of bits for the segment is by decreasing order of significance.

7. The method of claim 5 wherein setting the loading delay comprises lengthening the loading delay to the right shaft the bits of the segment thereby amplifying the digital audio signal, and shorting the loading delay to left shaft the bits of the segment thereby attenuating the analog audio signal, when the serial receiving of bits for the segment is by increasing order of significance.

8. The method of claim 5 wherein processing the segment of bits comprises setting each bit of the segment to a predetermined value when the volume control signal indicates a mute function.

* * * * *